(12) United States Patent
Luo

(10) Patent No.: US 8,901,964 B2
(45) Date of Patent: Dec. 2, 2014

(54) LEVEL SHIFTER CIRCUIT AND OPERATION METHOD THEREOF

(71) Applicant: Industrial Technology Research Institute, Hsinchu (TW)

(72) Inventor: Shien-Chun Luo, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/060,329

(22) Filed: Oct. 22, 2013

(65) Prior Publication Data

US 2014/0320168 A1    Oct. 30, 2014

(30) Foreign Application Priority Data

Apr. 25, 2013    (TW) .............................. 102114846 A

(51) Int. Cl.
*H03K 19/0175*    (2006.01)
*H03K 19/00*    (2006.01)

(52) U.S. Cl.
CPC ................................. *H03K 19/0013* (2013.01)
USPC ................ 326/81; 326/63; 326/112; 326/115

(58) Field of Classification Search
USPC ........................... 326/63, 68, 80–83, 112, 115
See application file for complete search history.

(56) References Cited

U.S. PATENT DOCUMENTS

| | | | |
|---|---|---|---|
| 6,477,092 B2 | 11/2002 | Takano | |
| 6,920,570 B2 | 7/2005 | Fujimoto | |
| 7,839,171 B1 * | 11/2010 | Miles et al. | ..................... 326/80 |
| 8,547,139 B2 * | 10/2013 | Hori et al. | ....................... 326/81 |
| 2003/0001628 A1 | 1/2003 | Hsu et al. | |
| 2007/0001739 A1 | 1/2007 | Boerstler et al. | |
| 2007/0109825 A1 | 5/2007 | Qiu et al. | |
| 2008/0143419 A1 | 6/2008 | Boerstler et al. | |
| 2010/0156498 A1 | 6/2010 | Bagepalli | |
| 2012/0182060 A1 | 7/2012 | Rana | |

FOREIGN PATENT DOCUMENTS

| | | |
|---|---|---|
| CN | 101093957 | 12/2007 |
| TV | I262649 | 9/2006 |
| TW | M348426 | 1/2009 |
| TW | I323074 | 4/2010 |
| TW | I331841 | 10/2010 |
| TW | I339012 | 3/2011 |

OTHER PUBLICATIONS

Lin, Yu-Shiang et al., Single Stage Static Level Shifter Design for Subthreshold to I/O Voltage Conversion, ISLPED '08, Aug. 11-13, 2008, Copyright 2008 ACM, pp. 197-200.

(Continued)

*Primary Examiner* — Don Le
(74) *Attorney, Agent, or Firm* — The Farrell Law Firm, P.C.

(57) ABSTRACT

A level shifter transfers a first voltage signal to a second voltage signal. The level shifter comprises a comparison circuit, a delay circuit, and a selection circuit. The comparison circuit generates a first signal according to the comparison result between the first voltage signal and the reverse-phase signal of the first voltage signal. The delay circuit generates a second signal according to the first voltage signal. The selection circuit receives the first and the second signals and chooses the higher voltage one from the first signal and the second signal to be the second voltage signal.

22 Claims, 15 Drawing Sheets

(56) References Cited

OTHER PUBLICATIONS

Chang, Ik Joon et al., Robust Level . . . , IEEE Transactions on Very Large Scale Integration (VLSI) Systems, vol. 19, No. 8, Aug. 2011, Copyright 2010 IEEE, pp. 1429-1437.

Kaul, Himanshu et al., A 320 mV 56 . . . , IEEE Journal of Solid-State Circuits, vol. 44, No. 1, Jan. 2009, Copyright 2008 IEEE, pp. 107-114.

Hsu, Steven et al., A 280mV-to . . . , ISSCC 2012/ Session 10/ High-Performance Digital/ 10.1, 2012 IEEE International Solid-State Circuits Conference, Copyright 2012 IEEE, pp. 3.

Wooters, Stuart N. et al., An Energy-Efficient . . . , IEEE Transactions on Circuits and Sytems-II: Express Briefs, vol. 57, No. 4, Apr. 2010, Copyright 2010 IEEE, pp. 290-294.

Lutkemeier, Sven et al., A Subthreshold to . . . , IEEE Transactions on Circuits and Systems-II: Express Briefs, vol. 57, No. 9, Sep. 2010, Copyright 2010 IEEE, pp. 721-724.

* cited by examiner

LEVEL SHIFTER CIRCUIT AND OPERATION METHOD THEREOF

PRIORITY

This application claims the benefit of Taiwan application serial no. 102114846, filed on Apr. 25, 2013, the subject matter of which is incorporated herein by reference.

TECHNICAL FIELD

The disclosure relates to a level shifter circuit and operation method thereof.

BACKGROUND

Low power consumption of integrated circuits is an important feature of modern technology products of compact size, high mobility, and green energy. However, multiple objectives increase the complexity and scale of integrated circuits (ICs), which easily results in high power consumption. Using multiple voltage levels is therefore a popular method to lower the power consumption of ICs. Level shifters play an important role for signal integrity among various voltage levels in these multiple-voltage IC designs, and wide-voltage-range level shifters provide a high flexibility in supply-voltage assignment, by which the circuit performance and power consumption can be adjusted. Currently, a wide voltage range can cover conventional super-threshold supply voltages and sub-threshold supply voltages for optimizing the power consumption of ICs, and the operating range of level shifters is required to expand accordingly.

FIG. 1 shows a schematic drawing of a level shifter 100. I1 is a low-voltage inverter. This level shifter is able to convert a sub-threshold input signal IN to a super-threshold output signal OUT. The level shifter 100 utilizes a two-stage structure of conventional cross-coupled level shifters. The driving strength of the P-type transistors is reduced in the first stage, where the diode clamps and drops the drain-to-source voltage of the P-type transistors. However, the level shifter 100 requires dual-threshold transistors, including standard-threshold and low-threshold transistors, to convert a sub-threshold input signal toward a super-threshold output signal. Moreover, the level shifter 100 needs to be adapted to the required supply-voltage ranges, otherwise the delay time of the level shifter 100 is very slow in some combinations of input-to-output voltages.

FIG. 2 shows a level shifter 200. The level shifter 200 utilizes a Wilson current mirror for stably converting a sub-threshold input signal IN3 to a super-threshold output signal OUT3. The level shifter 200 needs only the standard-threshold transistors. However, the level shifter 200 becomes very slow when the voltage difference is slight between the input and output levels, in which case the rising delay is much greater than the falling delay and not practical for IC application.

FIG. 3 shows a schematic drawing of another level shifter 300. The level shifter 300 utilizes a pair of cross-coupled NOR gates, where two N-type transistors, M16 and M17, are in charge of differential sensing. An inverted input signal is fed to the N-type transistors M18 to accelerate the speed of the level shifter. However, the available voltage of the input signal is confined to a near-threshold value due to the cross-coupled structure at the first stage.

A high-speed and wide-voltage-range lever shifter is urgent and critical for the IC industry, although it is very difficult that the operating range covers both sub-threshold and super-threshold voltages. In addition, bidirectional level conversion is valuable for multiple voltage ICs; bidirectional level conversion indicating that the level conversion can be performed from a low voltage to a high voltage and from a high voltage to a low voltage. Furthermore, it is preferred that the operating voltage range of the lever shifter is insensitive to the manufacturing technology, process variations, and operation environments.

SUMMARY OF THE DISCLOSURE

The present disclosure relates to a level shifter circuit and an operation method thereof. The disclosure describes a level shifter that transfers a first voltage signal to a second voltage signal. The level shifter comprises a comparison circuit, a delay circuit, and a selection circuit. The comparison circuit generates a first signal by comparing the original and reverse phase of the first voltage signal. The delay circuit generates a second signal by delaying the first voltage signal. The selection circuit, electrically connects to the comparison circuit and the delay circuit, receives the first and the second signals and selects the higher voltage one between the first and the second signals to be the second voltage signal.

The present disclosure describes an operation method of level conversion, comprising following steps. A level shifter receives a first voltage signal, which is compared with the reverse phase of the first voltage signal to generate a first signal. The level shifter generates a second signal, which is of the same logic value but is delayed with regard to the first voltage signal. The level shifter generates a second voltage signal by selecting the higher voltage signal from the first and the second signals.

In order to make the aforementioned features and advantages of the present disclosure comprehensible, preferred embodiments accompanied with figures are detailed below. It is to be understood that all foregoing and following descriptions of the disclosure are exemplary; the purpose is to provide details of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
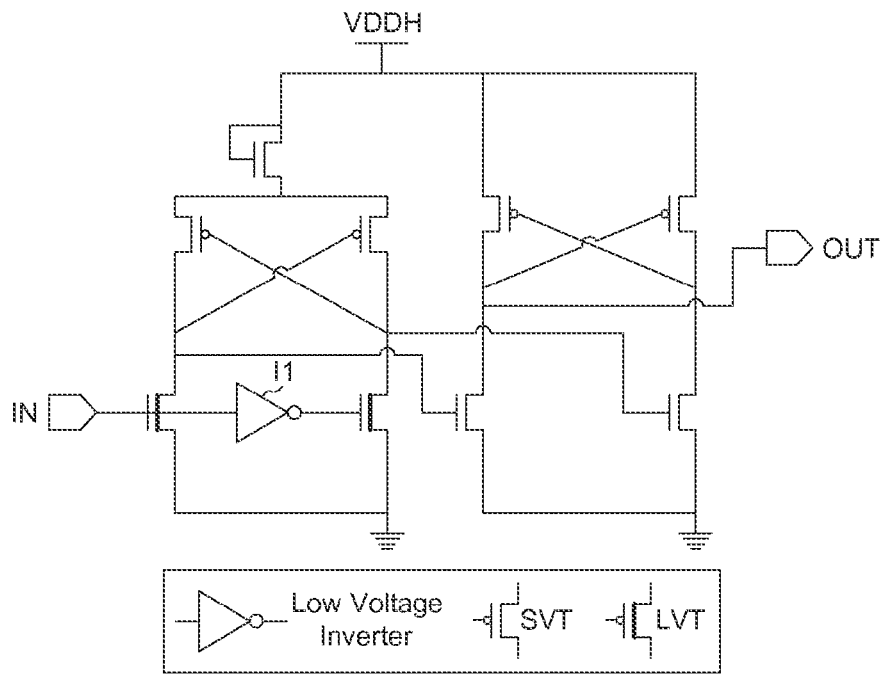
FIG. 1 illustrates a level shifter of related art.

Below, exemplary embodiments will be described in detail with regard to accompanying drawings, to be easily realized by a person having ordinary knowledge in the art. The inventive concept may be embodied in various forms without limit to the exemplary embodiments set forth herein. Descriptions of well-known parts are omitted for clarity, and like reference numerals refer to like elements throughout.

This disclosure discloses a wild-range level shifter for converting an input voltage to an output voltage. The voltage level of the input signal ranges from a sub-threshold voltage to the standard voltage defined by the transistor technology. The voltage level of the output signal also ranges from a sub-threshold voltage to the standard operation voltage defined by the transistor technology. The input voltage can be greater than, equal to, or less than the output voltage. In other words, upward and downward level conversion is available in this disclosure.

Figure 4:
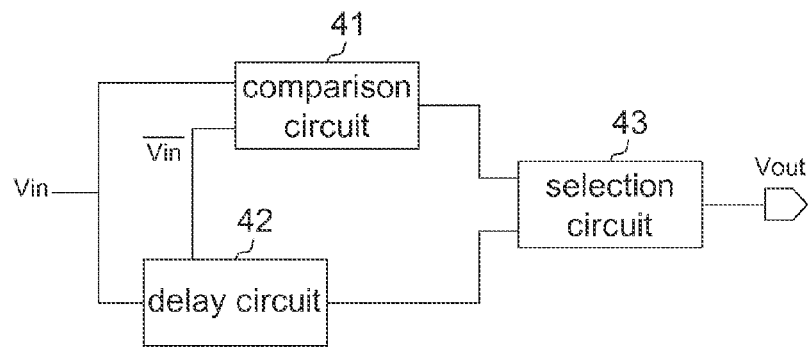
FIG. 4 illustrates a functional diagram of a level shifter according to an exemplary embodiment.

According to an exemplary embodiment, FIG. 4 is a functional block diagram of a level shifter. Referring to FIG. 4, a level shifter 400 comprises a comparison circuit 41, a delay circuit 42 and a selection circuit 43. The level shifter 400 converts a first voltage signal Vin to a second voltage signal $V_{OUT}$. The comparison circuit 41 receives the first voltage signal Vin and a reverse-phase signal $\overline{Vin}$ of the first voltage signal. The delay circuit 42 balances the rising delay time and the falling delay time of the level shifter 400. The selection circuit 43 is electrically connected to the comparison circuit 41 and the delay circuit 42 for selecting the higher voltage signal between the outputs of the comparison circuit 41 and the delay circuit 42.

Figure 5A:
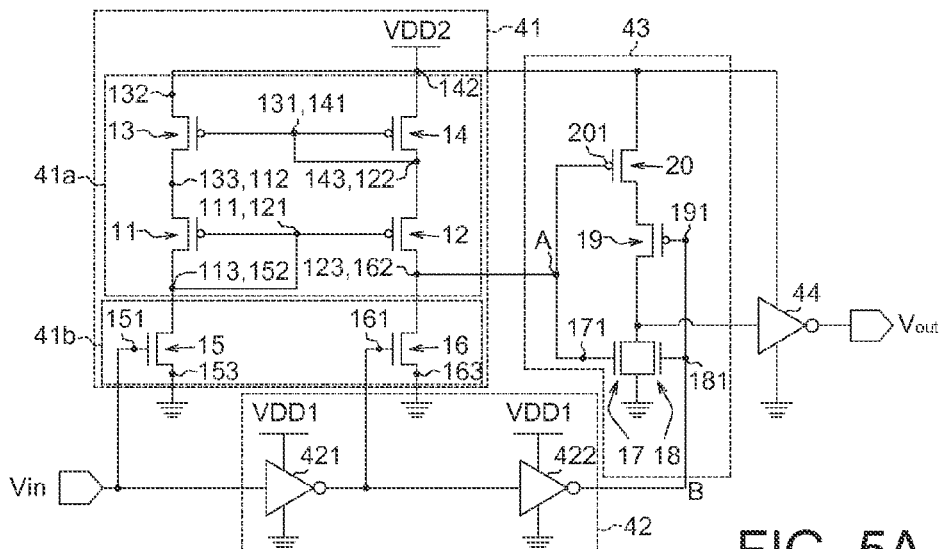
FIG. 5A illustrates a circuit diagram of a level shifter according to an exemplary embodiment.

Referring to FIG. 4 and FIG. 5A, FIG. 5A shows a schematic diagram of a level shifter in accordance with an exemplary embodiment. Including but not limited to, the level shifter shown in FIG. 5A is an exemplary application for the functional block diagram shown in FIG. 4. The circuit of the comparison circuit 41, the delay circuit 42 and the selection circuit 43 are shown in FIG. 5A, according to the exemplary embodiment of the disclosure, wherein the comparison circuit 41 comprises a current mirror circuit 41a and a current comparison circuit 41b. The supply voltages of input and output ends are a first high voltage VDD1 and a second high voltage VDD2, respectively. The first voltage signal Vin is to be converted to the second voltage signal Vout, wherein the logic-high voltage of the first voltage signal Vin is the first high voltage VDD1; the logic-high voltage of the second voltage signal Vout is the second high voltage VDD2; the logic-low voltage of both the first and second voltage signals, Vin and Vout, is ground. The first high voltage VDD1 ranges from a first sub-threshold voltage to the standard supply voltage of the transistor technology. The second high voltage VDD1 ranges from a second sub-threshold voltage to the standard supply voltage of the transistor technology.

The current mirror circuit 41a could be, for example, a cascode Wilson current mirror which comprises a first transistor 11, a second transistor 12, a third transistor 13, and a fourth transistor 14. The comparison circuit 41b could be implemented with differential inputs. The comparison circuit 41b comprises a fifth transistor 15 and a sixth transistor 16 which are connected to the current mirror circuit 41a. The current passing through the second transistor 12 and the fourth transistor 14 is a pull-up current, while the current passing through the sixth transistor 16 is a pull-down current. The current mirror circuit 41a makes the pull-up current passing through the second transistor 12 and the fourth transistor 14 equivalent to the current passing through the fifth transistor 15. Therefore, the signal A of the comparison circuit 41 is related to the result from comparing the currents respectively passing through the fifth transistor 15 and the sixth transistor 16. The currents respectively passing through the fifth transistor 15 and sixth transistor 16 are complementary, and then the signal A is easily to be pulled up or down.

According to the exemplary embodiment of the disclosure, the first transistor 11, the second transistor 12, the third transistor 13 and the fourth transistor 14 could be P-type metal-oxide-semiconductor field effect transistors (MOSFETs), hereafter referred to as PMOS. The fifth transistor 15 and the sixth transistor 16 could be N-type MOSFETs, hereafter referred to as NMOS.

The first transistor 11 comprises a first node 111, a second node 112 and a third node 113. The second transistor 12 comprises a first node 121, a second node 122 and a third node 123. The third transistor 13 comprises a first node 131, a second node 132 and a third node 133. The fourth transistor 14 comprises a first node 141, a second node 142 and a third node 143. The fifth transistor 15 comprises a first node 151, a second node 152 and a third node 153. The sixth transistor 16 comprises a first node 161, a second node 162 and a third node 163. The first node of each aforementioned transistor is the gate. The second node and the third node of each aforementioned N-type transistor are the drain and source, respectively. The second node and the third node of each aforementioned P-type transistor are the source and drain, respectively.

The first node 111 of the first transistor 11 and the first node 121 of the second transistor 12 are connected; the first node 111 of the first transistor 11 and the first node 121 of the second transistor 12 are connected to the third node 113 of the first transistor 11. The first node 131 of the third transistor 13 and the first node 141 of the fourth transistor 14 are connected to the third node 143 of the fourth transistor 14. The second node 112 of the first transistor 11 and the second node 122 of the second transistor 12 are connected to the third node 133 of the third transistor 13 and the third node 143 of the fourth transistor 14, respectively. The second node 132 of the third transistor 13 is connected to the second node 142 of the fourth transistor 14 and a second high voltage signal VDD2. The third node 123 of the second transistor 12 outputs a first signal A to the selection circuit 43. The first node 151 and the third node 153 of the fifth transistor 15 are connected to a first voltage signal Vin and a ground GND, respectively. The second node 152 of the fifth transistor 15 is connected to the third node 113 of a first transistor 11. The first node 161 of the sixth transistor 16 is connected to the reverse-phase signal Vin of the first voltage signal Vin. The third node 163 of the sixth transistor 16 is connected to the ground GND. The second node 162 of the sixth transistor 16 is connected to the third node 123 of the second transistor 12.

In the comparison circuit 41, the first voltage signal Vin and the reverse-phase signal $\overline{Vin}$ of the first voltage signal Vin are connected to the first node 151 of the fifth transistor 15 and the first node 161 of the sixth transistor 16, respectively. Therefore, the current passing through the fifth transistor 15 and the current passing through the sixth transistor 16 are complementary. In other words, while the current passing through the transistor 15 increases, the current passing through the transistor 16 decreases. The PMOS transistors in the current mirror circuit 41a generate corresponding currents. For example, the current passing through the second transistor 12 and the fourth transistor 14 is substantially equal to the current passing through the fifth transistor 15. Since the current passing through the fifth transistor 15 and the current passing through the sixth transistor 16 are complementary, the first signal A would easily reach 0 or 1 digital voltage level. The shortcoming of a conventional level shifter, which cannot accept an ultra-low-voltage input, can be overcome by the comparison circuit 41. The digital value of the first signal A outputted by the comparison circuit 41 is equal to the digital value of the first voltage signal Vin, while the logical-high voltage of the first signal A approximates to the voltage of second high voltage signal VDD2.

In FIG. 5A, the delay circuit 42 includes an inverter 421 and an inverter 422. The delay circuit 42 could also be a conductive wire or includes other electronic elements (may comprise, but not limited to, passive elements such as capacitors, resistors and inductors, etc.). For example, the delay circuit 42 comprises at least an inverter that is electrically connected to other odd number of inverters, so as to form an inverter chain consisting of even number of inverters. The delay circuit 42 can also include an inverter which is electrically connected to a delay element comprising capacitors and resistors. The inverter 421 is connected to the inverter 422. The inverter 421 is connected to the first voltage signal Vin. A second signal B is outputted from the inverter 422 and fed to the selection circuit 43. The delay circuit 42 is used to balance the rising and falling delays of the overall level shifter circuit considering a wide operating range; the purpose is to make the rising and falling delays similar, and approximate 50% duty cycle can be obtained.

Figure 5B:
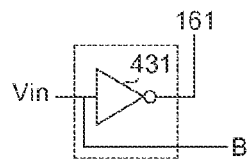
FIG. 5B illustrates a circuit diagram of a delay circuit according to an exemplary embodiment.
Figure 5C:
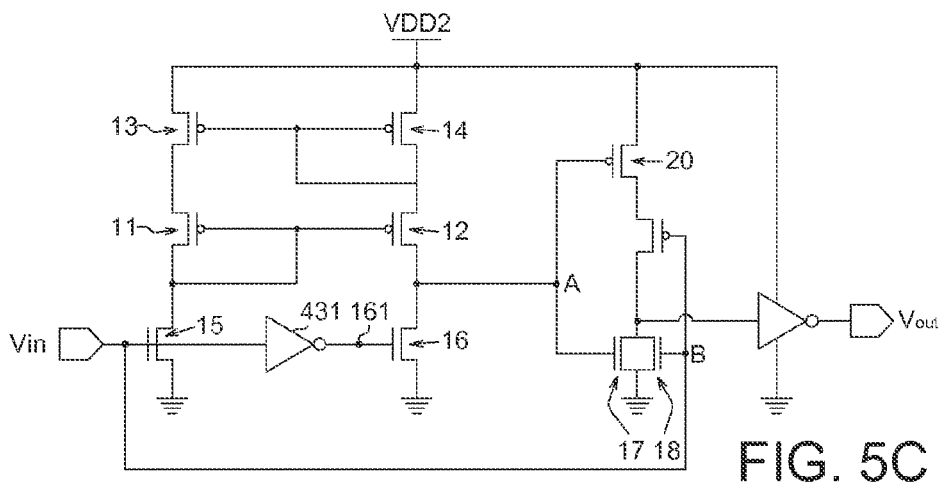
FIG. 5C illustrates a circuit diagram of a level shifter according to an exemplary embodiment.

FIG. 5B shows a schematic drawing for a delay circuit in accordance with an exemplary embodiment. FIG. 5C shows a schematic drawing for a level shifter in accordance with an exemplary embodiment. Referring to FIG. 5B, an inverter 431 in the dash line box could be used as a delay circuit which can replace the delay circuit 42 in FIG. 5A. The input terminal of the inverter 431 receives the first voltage signal Vin while the output terminal of the inverter 431 is connected to the first node 161 of the sixth transistor 16. The first voltage signal Vin could be used as the second signal B. The level shifter shown in FIG. 5C could be obtained by replacing the delay circuit 42 in FIG. 5A with the delay circuit in FIG. 5B.

Figure 5D:
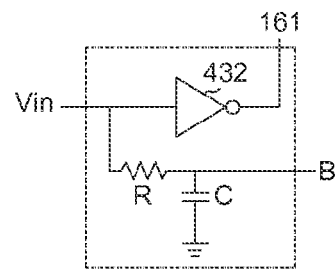
FIG. 5D illustrates a circuit diagram of a delay circuit according to an exemplary embodiment.

FIG. 5D shows a schematic drawing for a delay circuit in accordance with another embodiment. As shown in FIG. 5D, an inverter 432 in dash line box receives the first voltage signal Vin while the output terminal of the inverter 432 is connected to the first node 161 of the sixth transistor 16. In addition, the input terminal of the inverter 432 can be electrically connected to a capacitor C and a resistor R that are connected to act as a delay element. As shown in FIG. 5D, the delay circuit including the inverter 432, the capacitor C and the resistor R can replace the delay circuit 42 in FIG. 5A. This disclosure is not limited thereto. The delay circuit may be embodied in various forms such as the delay circuit 42 in FIG. 5A and the delay circuits in FIG. 5B and FIG. 5D, without limit to the exemplary embodiments.

The selection circuit 43 can be a NOR logic circuit or an OR logic circuit. A NOR logic circuit is used as an example for the selection circuit 43 in FIG. 5A. That is, the combination of the selection circuit 43 and the inverter 44 results in the OR logic function. According to an exemplary embodiment of the disclosure, the selection circuit 43 comprises a seventh transistor 17, an eighth transistor 18, a ninth transistor 19 and a tenth transistor 20. The first signal A is inputted to the first node 171 of the seventh transistor 17 and the first node 201 of the tenth transistor 20. The second signal B is inputted to the first node 181 of the eighth transistor 18 and the first node 191 of the ninth transistor 19. The selection circuit 43 receives the first signal A and the second signal B and selects the higher voltage signal between the first signal A and the second signal B to propagate. Finally, a second voltage signal Vout is outputted. According to an exemplary embodiment of the disclosure, the range of the first high voltage VDD1 is from a sub-threshold voltage to the standard supply voltage of the technology; the range of the second high voltage signal VDD2 is the same, from a sub-threshold voltage to the standard supply voltage of the technology. The minimum value of the abovementioned sub-threshold voltage approximates 0.1V in this exemplary embodiment; however, it is not limited thereto.

According to an exemplary embodiment of the disclosure, as shown in FIG. 5A, for example but is not limited to, assume a first voltage signal Vin is at the high level (logic 1). When the first voltage signal VDD1 is smaller than the second high voltage signal VDD2, the second voltage signal Vout is triggered by the first signal A. On the contrary, when the first voltage signal VDD1 is greater than the second high voltage signal VDD2, the second voltage signal Vout is triggered by the second signal B. When the first voltage signal VDD1 is equal to the second high voltage signal VDD2, the second voltage signal Vout is evenly triggered by either the first signal A or the second signal B.

According to an exemplary embodiment of the disclosure, as shown in FIG. 5A, for example but is not limited to, assume the first voltage signal Vin is at the low level (logic 0). The second voltage signal Vout is triggered by the first signal A considering all the situations, in which the first voltage signal VDD1 is smaller than, equal to, or larger than the second high voltage signal VDD2.

In the aforementioned embodiment, as shown in FIG. 5A, when the first high voltage signal VDD1 is greater than the second high voltage signal VDD2, the duty cycle can approximate 50% for the voltage conversion, explained as follows. Recalling the rising delay is triggered by the second signal B and the falling delay is triggered by the first signal A in this case. The falling delay of the first signal A consists of the delay of inverter 421 and the transistor 16; the rising delay of the second signal B consists of the delay of the inverter 421 and the inverter 422. Having the similar delay paths and stages, the rising and falling delays are easily to be designed similar to obtain an approximate 50% duty cycle.

According to the aforementioned embodiment, the rising and the falling delays of the first signal A can also be balanced by using the cascade Wilson current mirror when the first high voltage signal VDD1 is smaller than the second high voltage signal VDD2. Recalling both the rising and falling delays of the level shifter are triggered by the first signal A in this case, the cascade Wilson current mirror having balanced pull-up and pull-down currents makes the first signal A to have balanced rising and falling delays. For additional details, no high quiescent current exists in the cascode Wilson current mirrors in the comparison circuit 41. Regarding that a high quiescent current is the defect when using a conventional and simple current mirror and biasing by a super-threshold input, in contrast, only sub-threshold leakage exists in the comparison circuit 41.

The selection circuit 43 is connected to the inverter 44 that acts as a driving circuit. The inverter 44 outputs the second voltage signal Vout and can drive a large load. In this exemplary embodiment, the high voltage level of the second voltage signal Vout is equal to the second high voltage signal VDD2.

Figure 6:
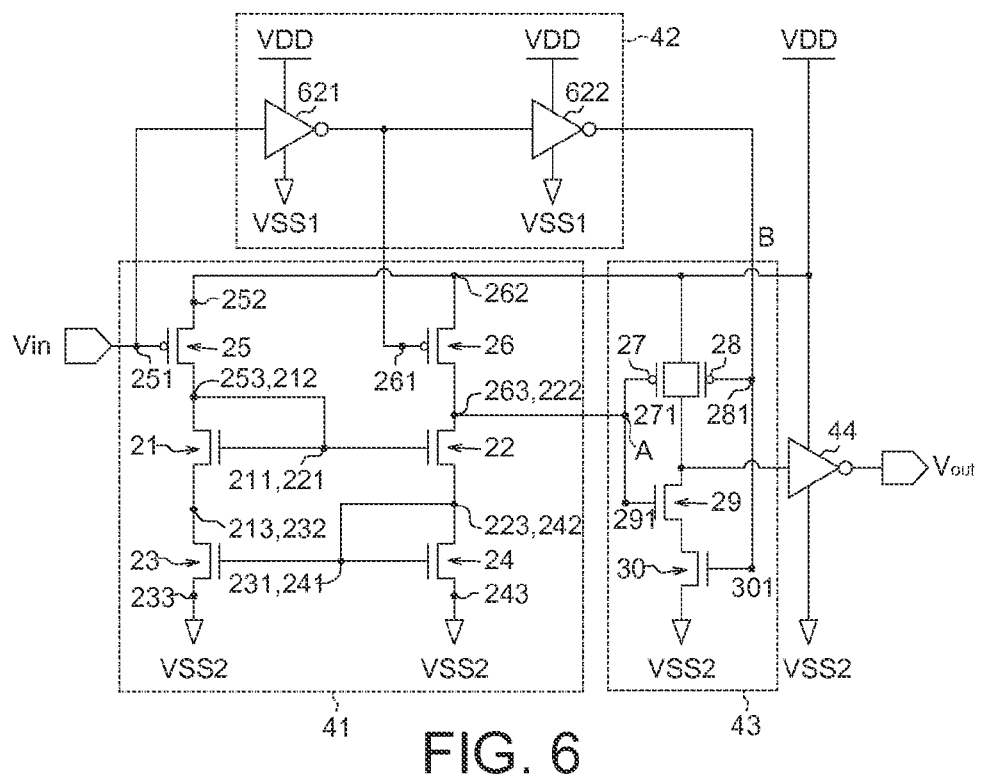
FIG. 6 illustrates a circuit diagram of a level shifter according to another exemplary embodiment.
Figure 7:
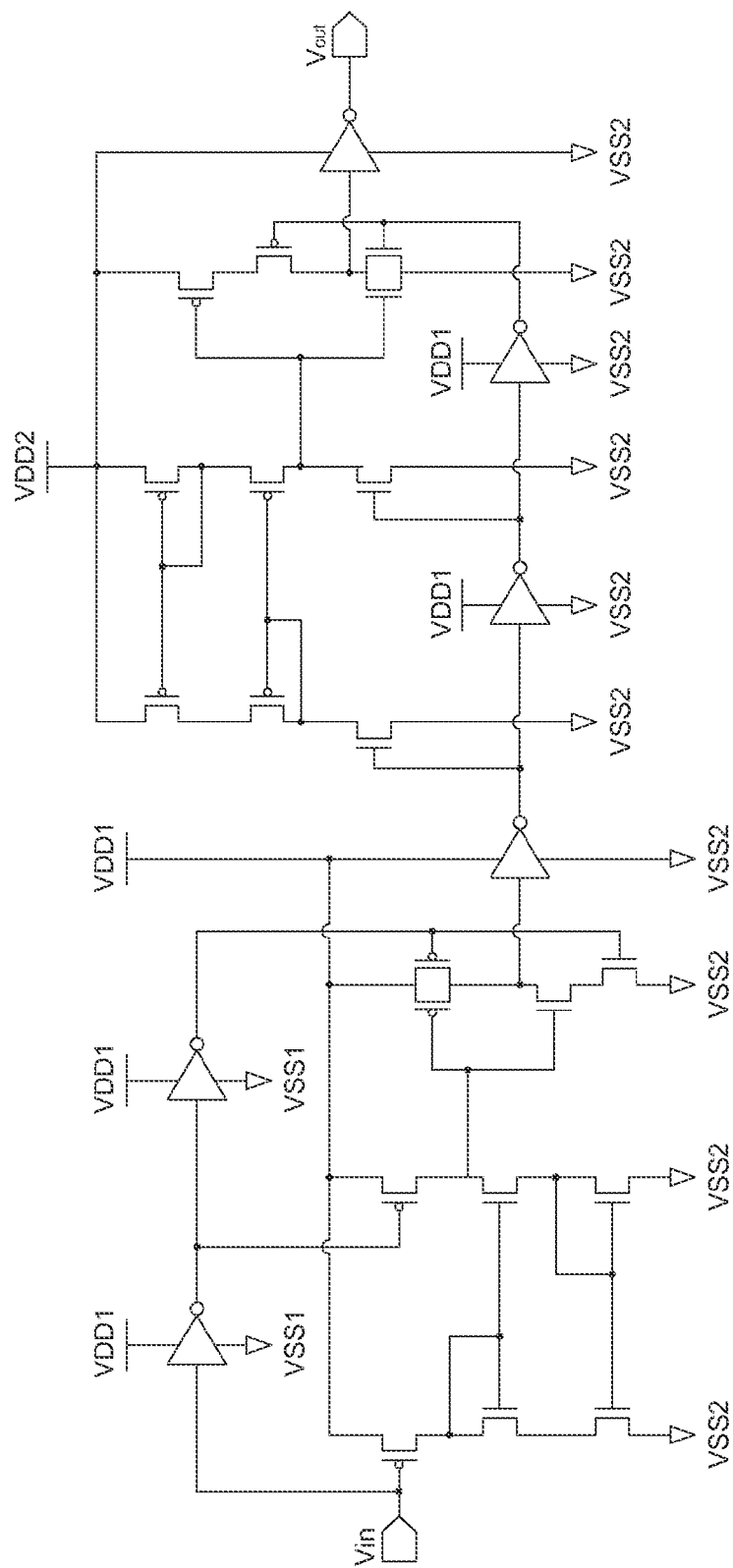
FIG. 7 illustrates a circuit diagram of a level shifter according to another exemplary embodiment.

Referring FIG. 4 and FIG. 6, FIG. 6 is a schematic diagram illustrating a level shifter according to another embodiment of the disclosure. The comparison circuit 41, the delay circuit 42 and the selection circuit 43 are connected to a common voltage VDD.

FIG. 6 discloses another circuit for the comparison circuit 41, the delay circuit 42 and the selection circuit 43. The comparison circuit 41 comprises an eleventh transistor 21, a twelfth transistor 22, a thirteenth transistor 23, a fourteenth transistor 24, a fifteenth transistor 25, and a sixteenth transistor 26. The eleventh transistor 21, the twelfth transistor 22, the thirteenth transistor 23, and the fourteenth transistor 24 can be N-type MOSFETs, hereafter referred to as NMOS. The fifteenth transistor 15 and the sixteenth transistor 16 could be P-type MOSFETs, hereafter referred to as PMOS.

The eleventh transistor 21 comprises a first node 211, a second node 212 and a third node 213. The twelfth transistor 22 comprises a first node 221, a second node 222 and a third node 223. The thirteenth transistor 23 comprises a first node 231, a second node 232 and a third node 233. The fourteenth transistor 24 comprises a first node 241, a second node 242 and a third node 243. The fifteenth transistor 25 comprises a first node 251, a second node 252 and a third node 253. The sixteenth transistor 26 comprises a first node 261, a second node 262 and a third node 263. The first node of each aforementioned transistor is gate. The second node and the third node of each aforementioned N-type transistor are drain and source, respectively. The second node and the third node of each aforementioned P-type transistor are source and drain, respectively.

The first node 211 of the eleventh transistor 21 is connected to the first node 221 of the twelfth transistor 22. The first node 211 of the eleventh transistor 21 and the first node 221 of the twelfth transistor 22 are connected to the second node 212 of the eleventh transistor 21 and the third node 253 of the fifteenth transistor 25. The first node 231 of the thirteenth transistor 23 and the first node 241 of the fourteenth transistor 24 are connected to the second node 242 of the fourteenth transistor 24 and the third node 223 of the twelfth transistor 22. The third node 233 of the thirteenth transistor 23 and the third node 243 of the fourteenth transistor 24 are connected to a second low voltage signal VSS2. The second node 222 of the twelfth transistor 22 is connected to the third node 263 of the sixteenth transistor 26 and outputs a first signal A to the selection circuit 43. The first node 251 of the fifteenth transistor 25 is connected to a first voltage signal Vin. The third node 253 of the fifteenth transistor 25 is connected to the second node 212 of the eleventh transistor 21. The first node 261 of the sixteenth transistor 26 is connected to the reverse-phase signal of the first voltage signal. The third node 263 of the sixteenth transistor 26 is connected to the second node 222 of the twelfth transistor 22.

In FIG. 6, the delay circuit 42 includes an inverter 621 and an inverter 622. The delay circuit 42 could also be a conductive wire or includes other electronic elements (may comprise, but not limited to, passive elements such as capacitors, resistors, inductors, etc.). For example, the delay circuit 42 includes an even number of inverters. The delay circuit 42 can also include an inverter that is electrically connected to a delay element consisting of capacitors and resistors. However, the disclosure is not limited thereto. Other embodiments for the delay circuit 42 are similar to that shown in FIG. 5B and FIG. 5D, so the details will not be repeated here. In FIG. 6, the inverter 621 is connected to the inverter 622. The inverter 621 is connected to the first voltage signal Vin. A second signal B is outputted from the inverter 622, and inputted to the selection circuit 43. The delay circuit 42 is used to balance the rising and falling delay of the overall level shifter circuit considering a wide operating range. Making the rising and falling delay equal results in an approximate 50% duty cycle.

The selection circuit 43 can be a NAND logic circuit or an AND logic circuit. A NAND logic circuit is an example for the selection circuit 43 in FIG. 6. The combination of the selection circuit 43 and the inverter 44 is an AND logic circuit. According to an exemplary embodiment of the disclosure, the selection circuit 43 comprises a seventeenth transistor 27, an eighteenth transistor 28, a nineteenth transistor 29 and a twentieth transistor 30. The first signal A is inputted to the first node 271 of the seventeenth transistor 27 and the first node 291 of the nineteenth transistor 29. The second signal B is inputted to the first node 281 of the eighteenth transistor 28 and the first node 301 of the twentieth transistor 30. After the selection circuit 43 receives the first signal A and the second signal B, the selection circuit 43 will select the faster arrival signal between the first signal A and the second signal B that arrives at the second low voltage VSS2. Finally, a second voltage signal Vout, at the second low voltage VSS2, is outputted. According to an exemplary embodiment of the disclosure, the input swing of the first voltage signal Vin is from a first low voltage VSS1 to a third voltage VDD; the output swing of the second voltage signal Vout is from the second low voltage VSS2 to the third voltage VDD. In this exemplary embodiment, the maximum voltage of the first low voltage VSS1 and the second low voltage VSS2 can be (VDD-0.1V), which value is not limited thereto. In other words, the minimum difference between the third voltage VDD and the first low voltage VSS1 can be 0.1V, and so is the minimum difference between the third voltage VDD and the second low voltage VSS2, although 0.1V is not limited thereto.

The second voltage signal Vout is connected to the inverter 44 which acts as a driving circuit to drive a large load. In FIG. 6, the voltage swing of the second voltage signal Vout is from the third voltage VDD to the second low voltage signal VSS2.

Referring to FIG. 4, FIGS. 5A-5D, FIG. 6, and FIG. 7, FIG. 7 shows a schematic drawing for a level shifter in accordance with another embodiment. Combining the embodiments in FIGS. 5A-5D and FIG. 6 constructs another level shifter with a bidirectional expansion of the output voltage level. In FIG.

7, the voltage swing of the second voltage signal Vout is from the second high voltage VDD2 to the second low voltage signal VSS2.

Figure 8A:
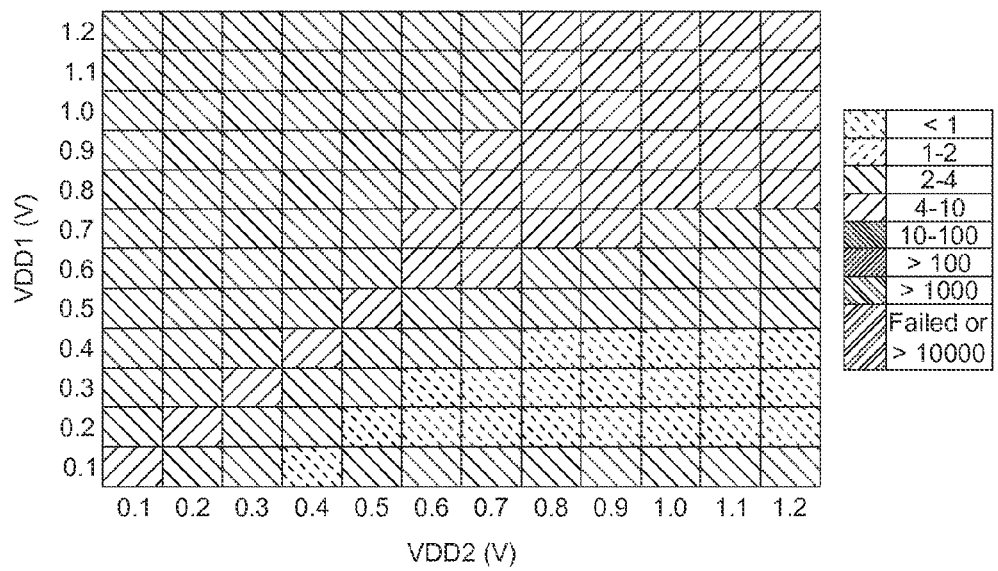
FIG. 8A illustrates the delay plot in two-dimensional histograms of a level shifter according to an exemplary embodiment.
Figure 8B:
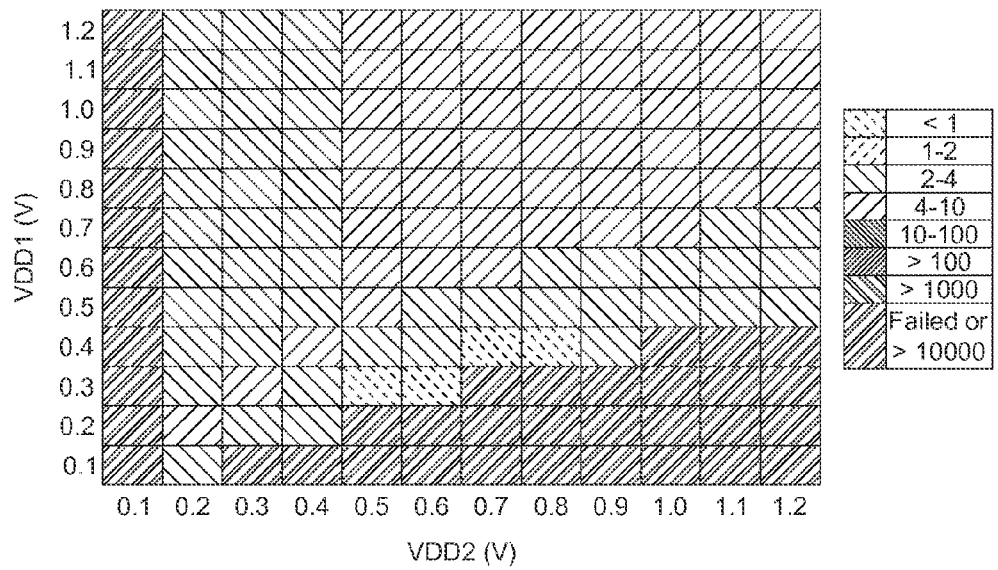
FIGS. 8B, 8C, and 8D illustrate the delay plots in two-dimensional histograms of the level shifters corresponding to the circuits in FIG. 3, FIG. 1 and FIG. 2, respectively.
Figure 8C:
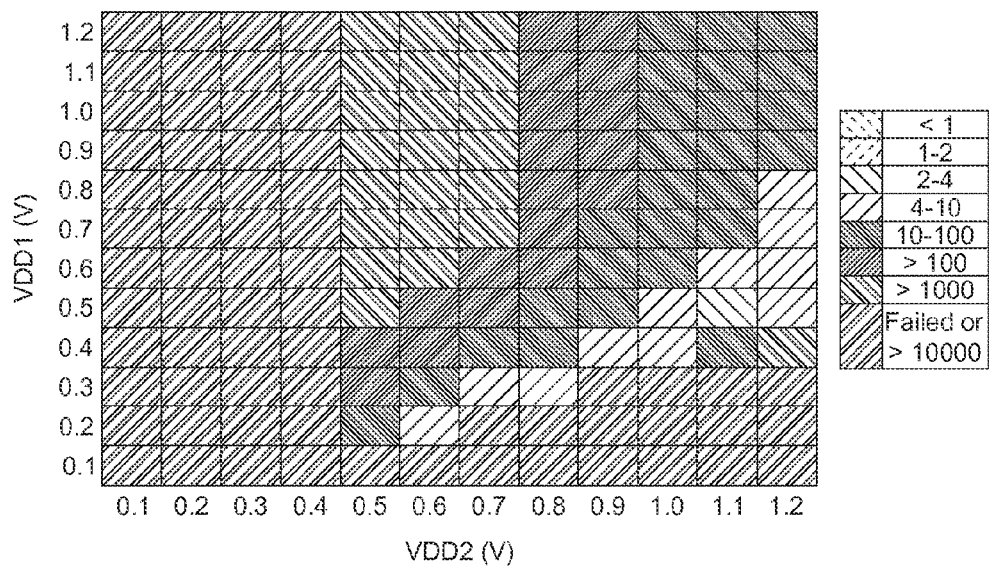
Figure 8D:
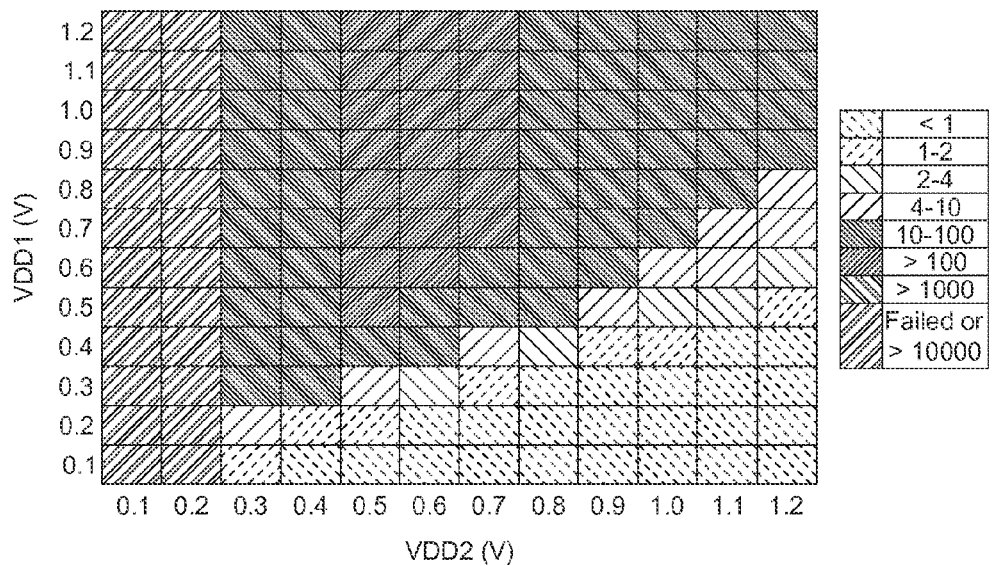

FIG. 8A, FIG. 8B, FIG. 8C and FIG. 8D are normalized delay plots in two-dimensional histograms. The normalization factor is the delay of a standard buffer that is supplied by the lower voltage level between the first voltage signal VDD1 and the second voltage VDD2. The normalized delay represents the relative level-shifter delay in a wide range of operating voltage. Using the normalized delay increases the clarity of the delay distribution because the absolute delay is distributed in an exponential attitude and hard to be compared in detail among different voltages and figures. The vertical axis is the first voltage signal VDD1(V); the horizontal axis is the second voltage signal VDD2(V). FIG. 8A is the delay histogram in accordance with this embodiment. FIG. 8B, FIG. 8C and FIG. 8D are the delay histograms corresponding to the circuits in FIG. 3, FIG. 1 and FIG. 2, respectively. FIG. 8A shows a full-range operability in the embodiment, while FIG. 8B, FIG. 8C and FIG. 8D shows some serious delay or failure blocks. For example, FIG. 8B shows many failure blocks when the second voltage signal VDD2 is at 0.1V or the first voltage signal VDD1 is less than 0.3V. FIG. 8C and FIG. 8D also shows some failure blocks, where the corresponding circuits cannot be operated. Therefore, the circuits in FIG. 1, FIG. 2 and FIG. 3 have restricted operating range compared with the embodiment.

Figure 9A:
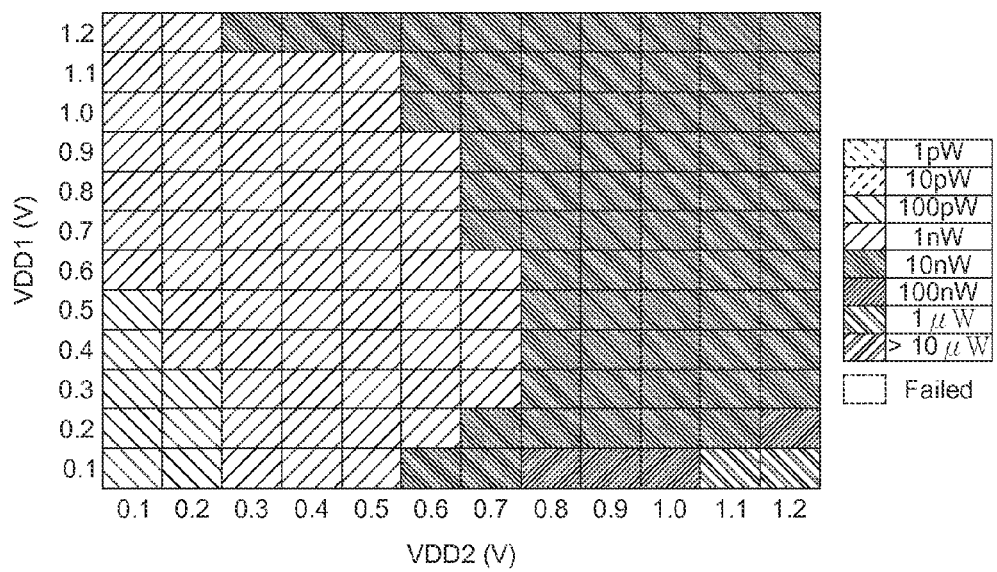
FIG. 9A illustrates the power-consumption plot in two-dimensional histograms of a level shifter according to an exemplary embodiment.
Figure 9B:
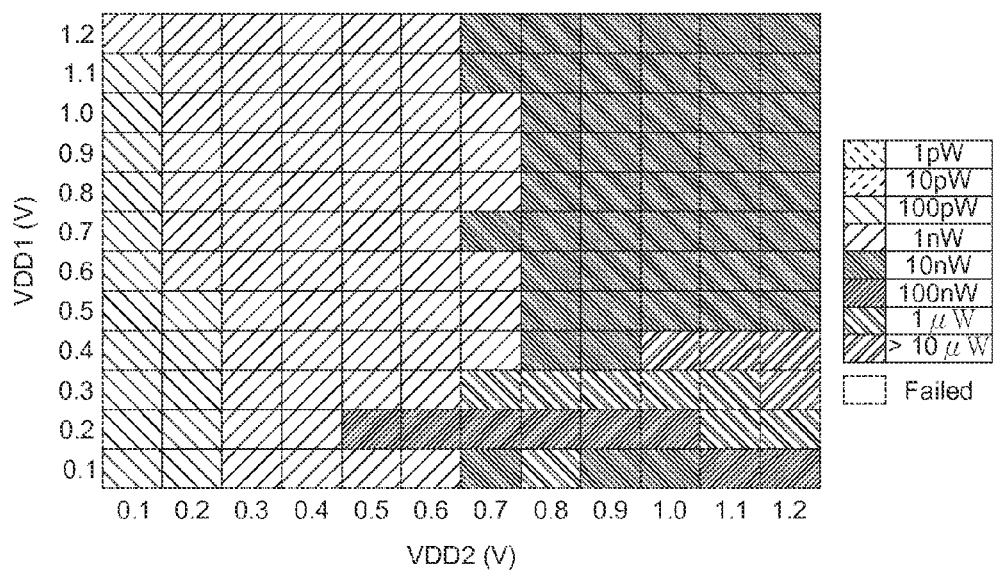
FIGS. 9B, 9C, and 9D illustrate power-consumption plots in two-dimensional histograms of three other level shifters corresponding to the circuits in FIG. 3, FIG. 1 and FIG. 2, respectively.
Figure 9C:
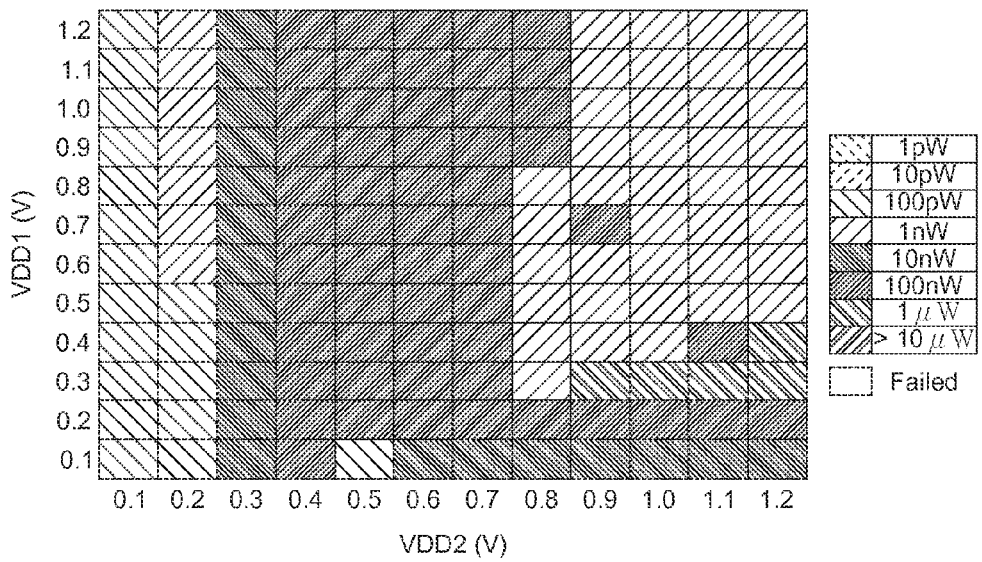
Figure 9D:
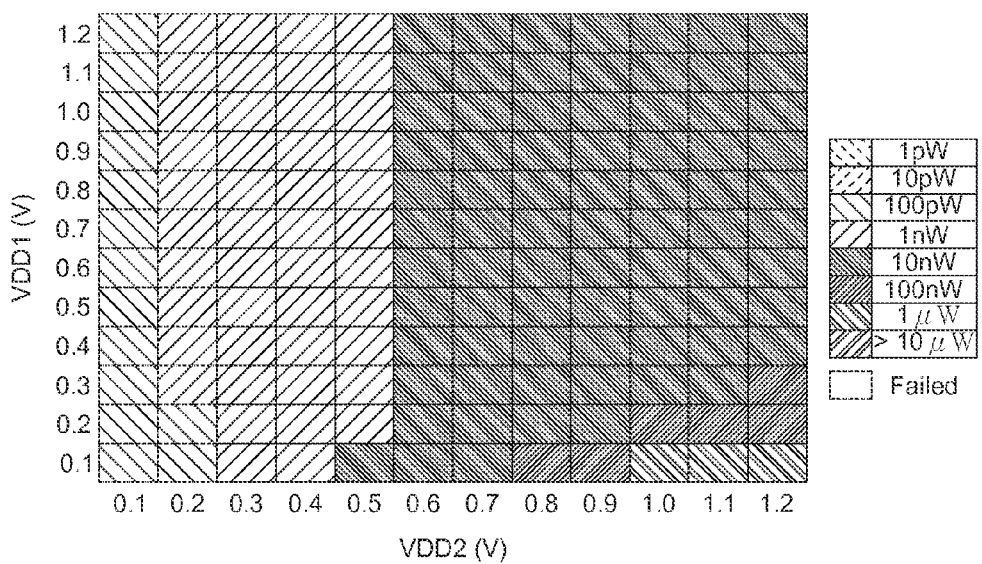

FIG. 9A, FIG. 9B, FIG. 9C, and FIG. 9D are power-consumption plots in two-dimensional histograms. The vertical axis is the first voltage signal VDD1(V); the horizontal axis is the second voltage signal VDD2(V). FIG. 9A is the power-consumption histogram in accordance with this embodiment. FIG. 9B, FIG. 9C and FIG. 9D are the power-consumption histograms corresponding to the circuits in FIG. 3, FIG. 1 and FIG. 2, respectively. The power consumption histograms herein ensure that all the level shifters consume at most 10 nW, which is under a reasonable scale. FIG. 9A, FIG. 9B, FIG. 9C, and FIG. 9D show the power consumption of all the corresponding level shifters is roughly fair, where the failure blocks are not considered.

Figure 2:
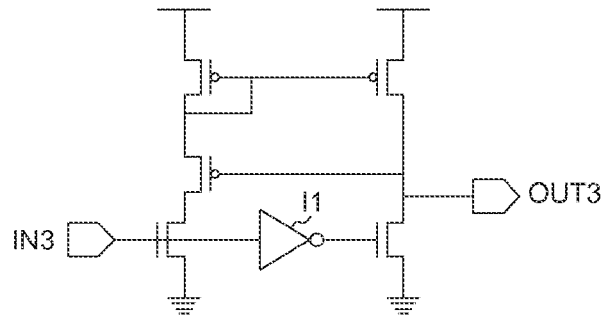
FIG. 2 illustrates another level shifter of related art.
Figure 3:
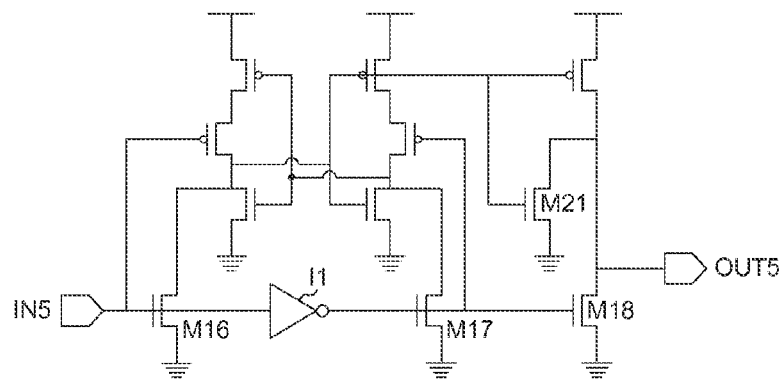
FIG. 3 illustrates another level shifter of related art.
Figure 10A:
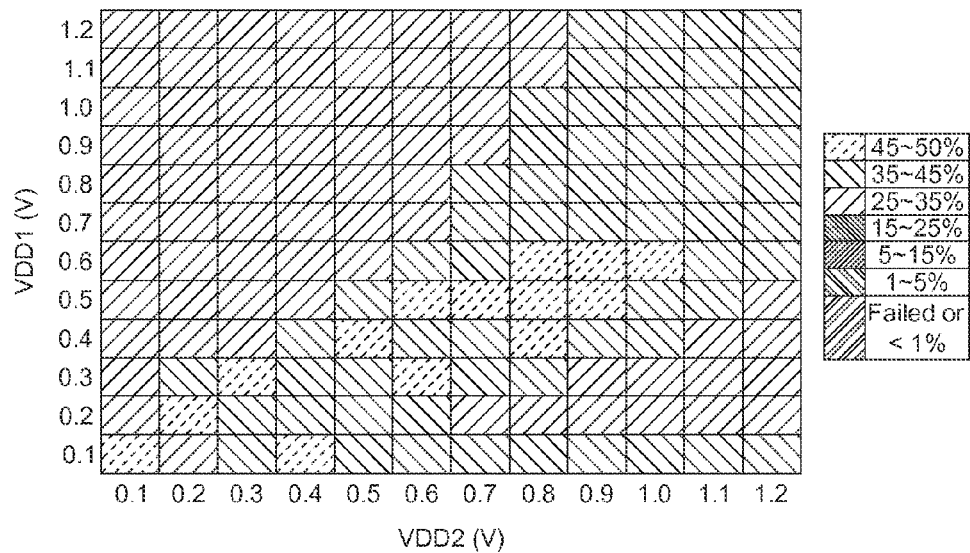
FIG. 10A illustrates the duty-cycle plot in two-dimensional histograms of a level shifter according to an exemplary embodiment.
Figure 10B:
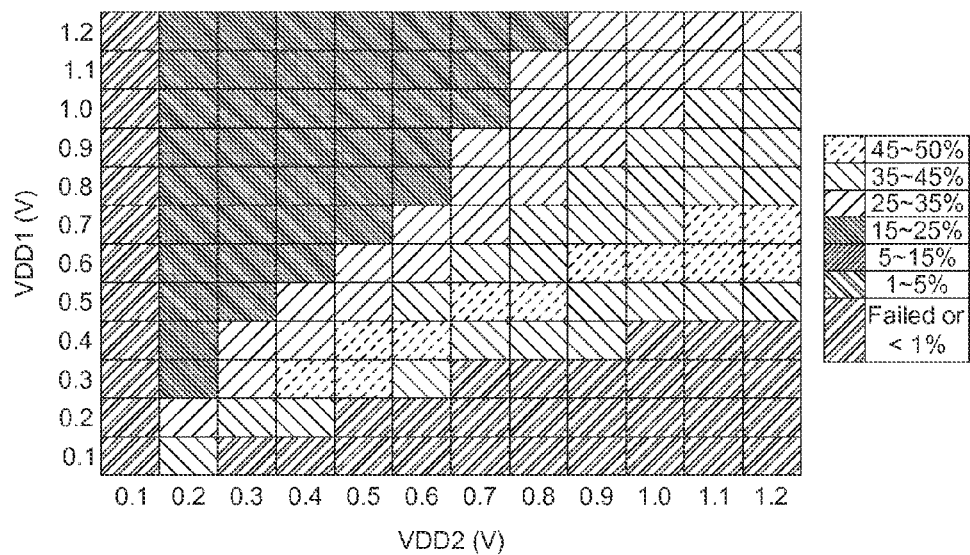
FIGS. 10B, 10C, and 10D illustrate duty-cycle plots in two-dimensional histograms of three other level shifters corresponding to the circuits in FIG. 3, FIG. 1 and FIG. 2, respectively.
Figure 10C:
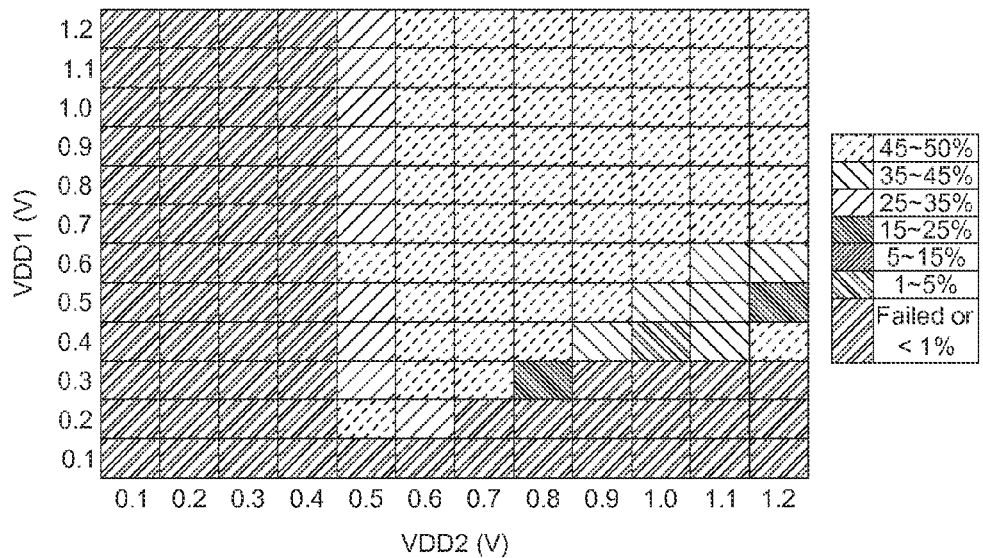
Figure 10D:
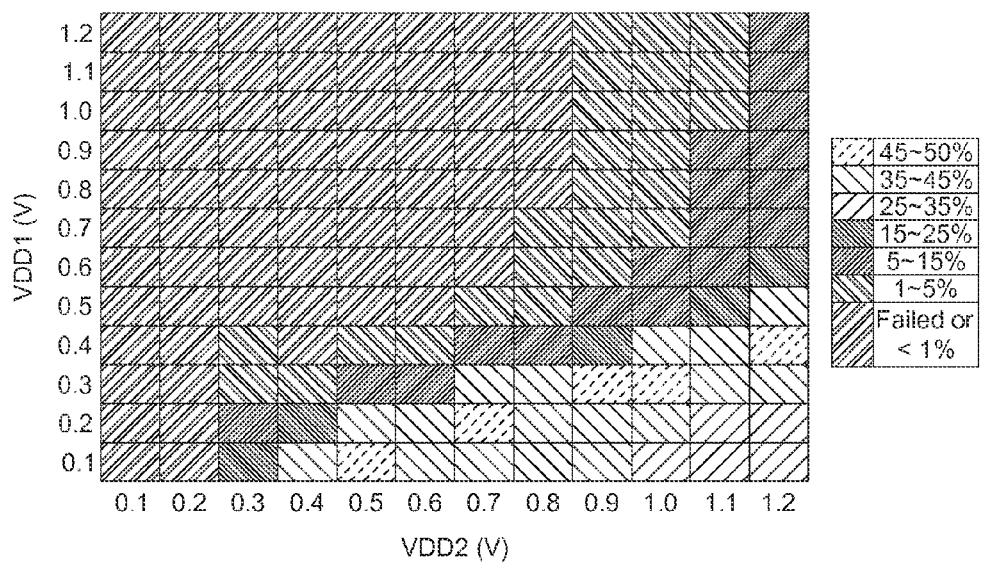

FIG. 10A, FIG. 10B, FIG. 10C and FIG. 10D are duty cycle in two-dimensional histograms. The vertical axis is the first voltage signal VDD1(V); the horizontal axis is the second voltage signal VDD2(V). FIG. 10A is the duty cycle pattern in accordance with this embodiment. FIG. 10B, FIG. 10C and FIG. 10D are the duty cycle patterns corresponding to the circuits in FIG. 3, FIG. 1 and FIG. 2, respectively. FIG. 1, FIG. 2, and FIG. 3 show very small duty cycles when the first voltage signal VDD1 or the second voltage signal VDD2 is low; these small duty cycles indicate the corresponding circuits cannot be practically operated. The failure blocks are inherent from those in delay histograms (FIG. 8B, FIG. 8C and FIG. 8D). These small duty cycles and failure blocks indicate the circuits in FIG. 1, FIG. 2, and FIG. 3 have limited operating range.

Figure 11A:
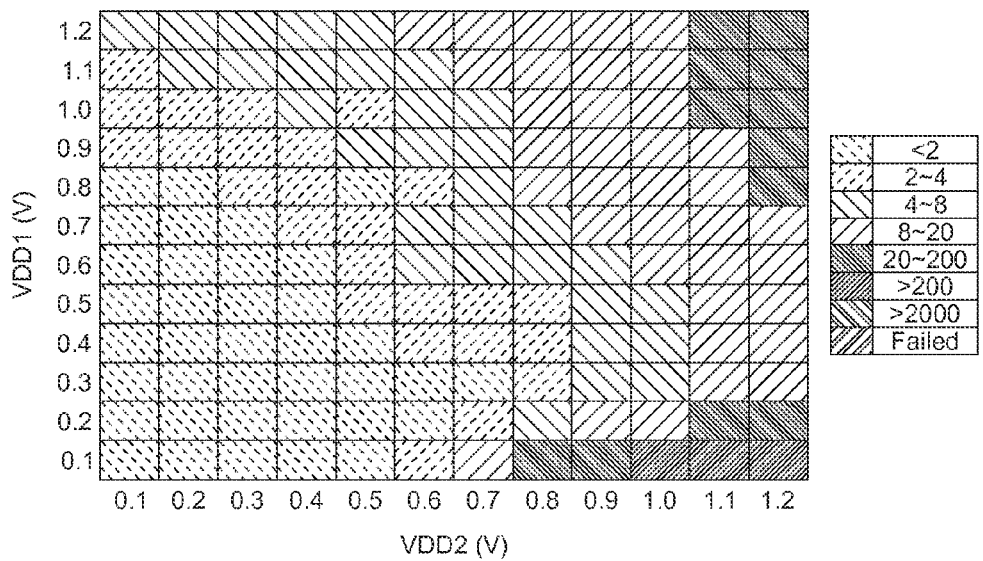
FIG. 11A illustrates the joint histogram, displaying the product of the normalized delay, power consumption (nW), and reciprocal of the duty cycle of a level shifter according to an exemplary embodiment.
Figure 11B:
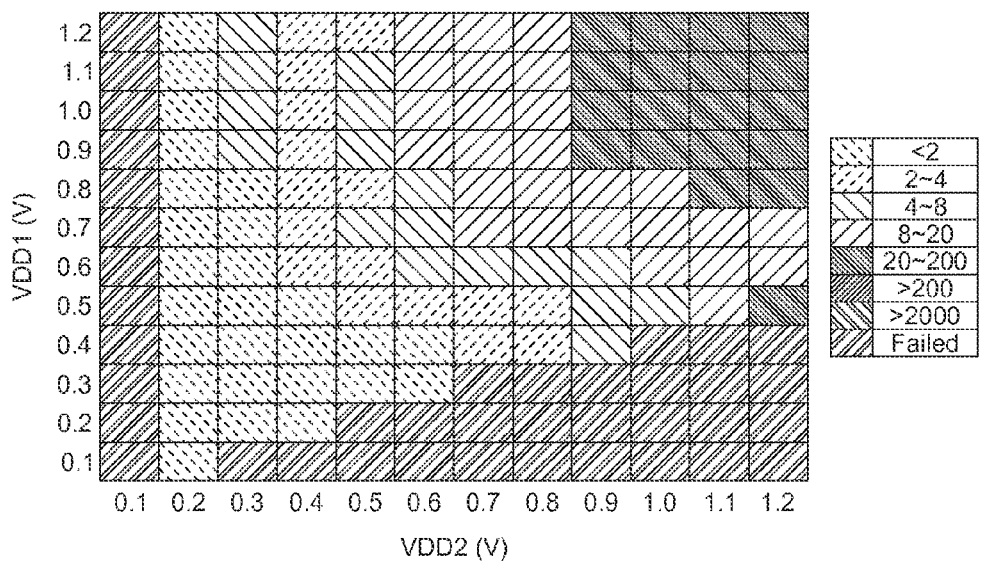
FIGS. 11B, 11C, and 11D illustrate the joint histograms of three other level shifters corresponding to the circuits in FIG. 3, FIG. 1 and FIG. 2, respectively.
Figure 11C:
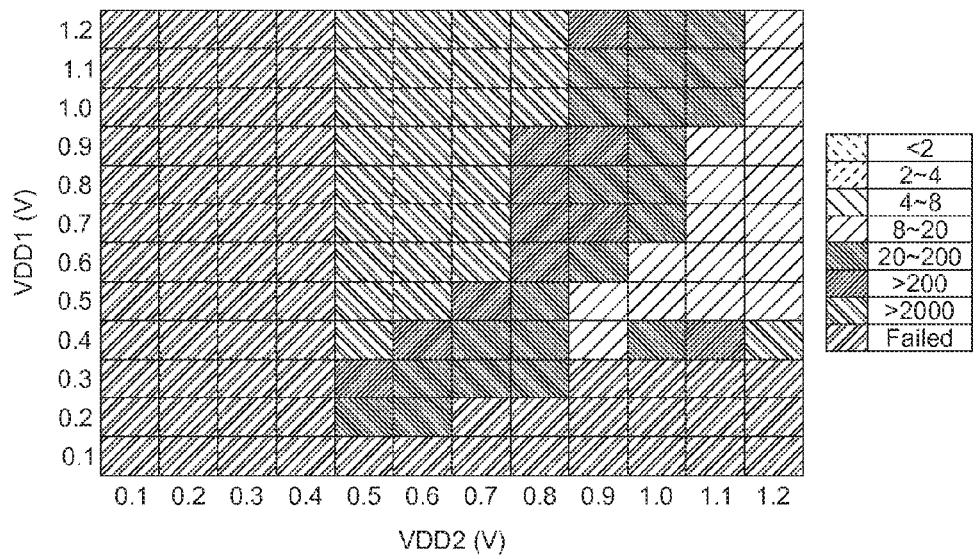
Figure 11D:
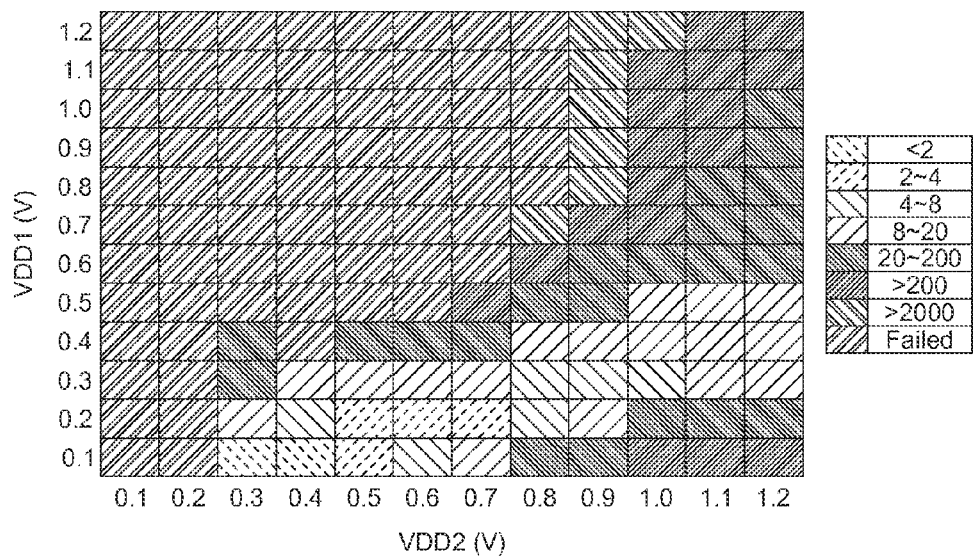

Referring to FIG. 8A~FIG. 8D, FIG. 9A~FIG. 9D and FIG. 10A~FIG. 10D, FIG. 11A~FIG. 11D are the joint histograms, displaying the product of the normalized delay, power consumption (nW), and reciprocal of the duty cycle of corresponding level shifters. The vertical axis is the first voltage signal VDD1(V); the horizontal axis is the second voltage signal VDD2(V). FIG. 11A is the joint histogram in accordance with this embodiment. FIG. 11B, FIG. 11C and FIG. 11D are the joint histograms corresponding to the circuits in FIG. 3, FIG. 1 and FIG. 2, respectively. The joint histograms show overall comparisons among delay, power consumption, and duty cycle. The circuits in FIG. 1, FIG. 2, and FIG. 3 have obvious limits in the operating range.

Figure 12A:
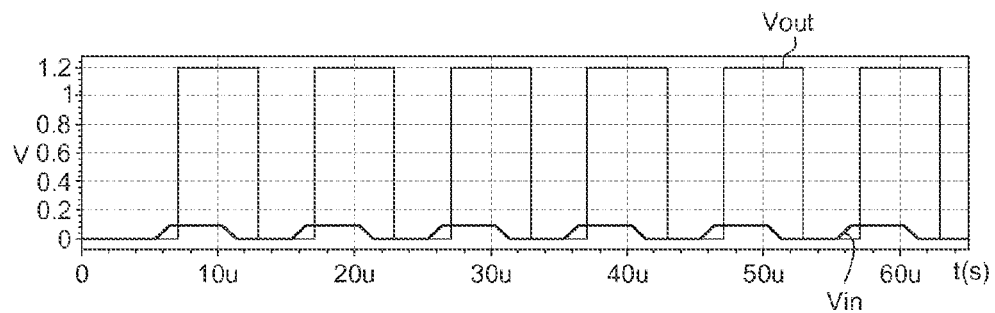
FIGS. 12A, 12B, and 12C are waveform graphs showing extra-low and wide-range voltage conversion results with regard to the transistors of different technologies with different threshold voltages (Vt).
Figure 12B:
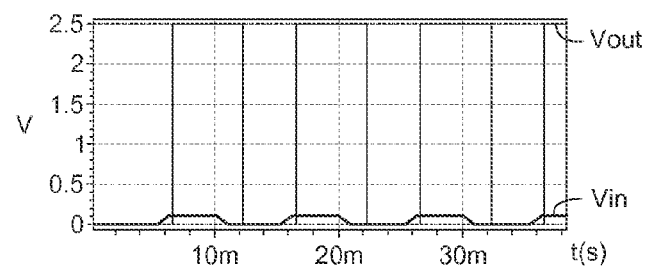
Figure 12C:
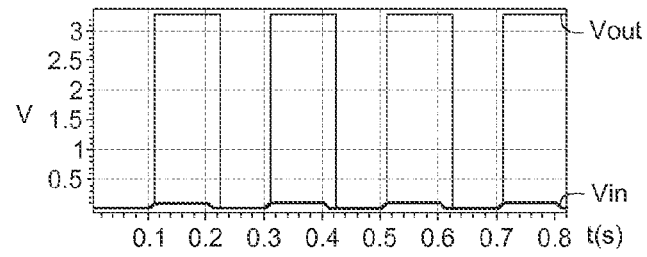

FIG. 12A, FIG. 12B and FIG. 12C are waveform graphs showing extra-low and wide-range voltage conversion results with regard to the transistors of different technologies with different threshold voltages (Vt). FIG. 12A shows the waveform of using 65-nanometer low-power 1.2V transistor technology. The standard supply voltage of these transistors is 1.2V, and the delay scale approximates 1 μs for converting the level from 0.1V to 1.2V.

FIG. 12B shows the waveform of using 65-nanometer low-power 2.5V transistor technology. The standard supply voltage of these transistors is 2.5V, and the delay scale approximates 1 ms for converting the level from 0.1V to 2.5V.

FIG. 12C shows the waveform of using 65-nanometer low-power 3.3V transistor technology. The standard supply voltage of these transistors is 3.3V, and the delay scale approximates 10 ms for converting voltage 0.1V to 3.3V.

Figure 13:
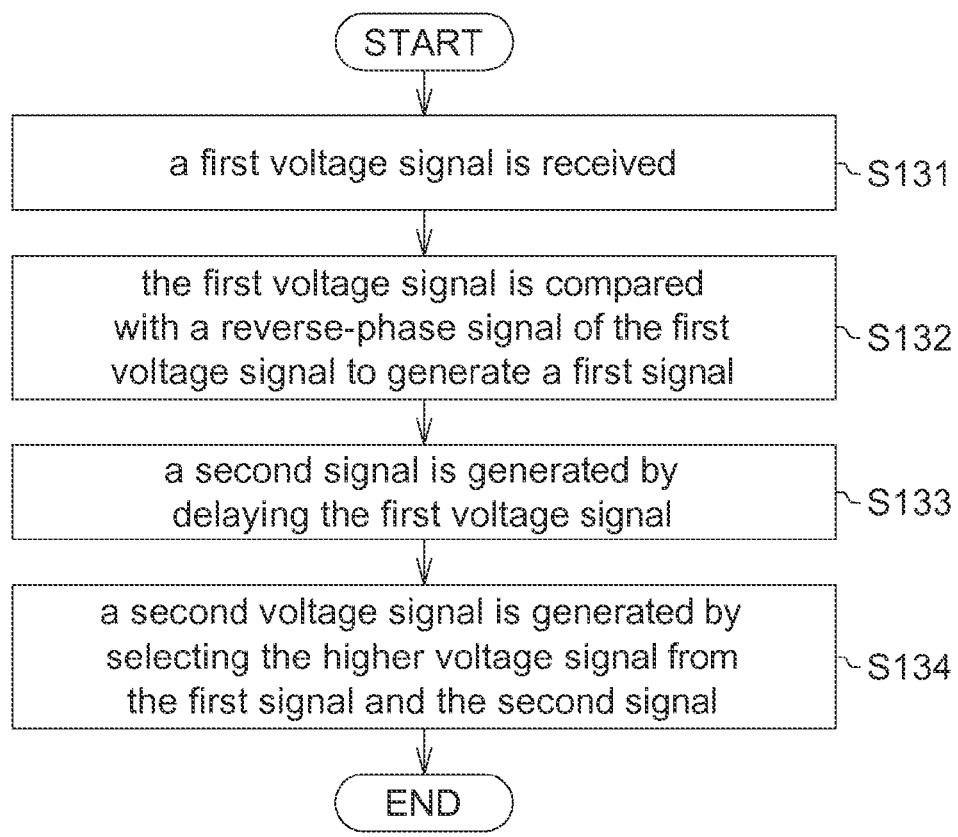
FIG. 13 illustrates the flowchart of an operation method for level conversion according to an exemplary embodiment.

FIG. 13 shows a flowchart of an operation method for level conversion. Refer to FIG. 5 and FIG. 13. In step S131, a first voltage signal Vin is received. In step S132, the first voltage signal Vin is compared with a reverse-phase signal of the first voltage signal to generate a first signal A. According to an exemplary embodiment, the comparison circuit 41 comprising a Wilson current mirror circuit can be utilized. In step S133, a second signal B is generated by delaying the first voltage signal Vin. According to an exemplary embodiment, the delay circuit 42 generates the second signal B. In step S134, a second voltage signal Vout is generated by selecting the higher voltage signal from the first signal A and the second signal B. According to an exemplary embodiment, step S134 could be performed by electrically connecting the selection circuit 43 to the comparison circuit 41 and the delay circuit 42. The delay circuit comprises an inverter chain consisting of an even number of inverters to generate the second signal.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A level shifter transferring a first voltage signal to a second voltage signal, comprising:
    a comparison circuit for comparing the first voltage signal with a reverse-phase signal of the first voltage signal to generate a first signal;
    a delay circuit for generating a second signal according to the first voltage signal; and
    a selection circuit electrically connected to the comparison circuit and the delay circuit, for receiving the first signal and the second signal, and choosing the higher voltage from the first signal and the second signal to be the second voltage signal.

2. The level shifter according to claim 1, wherein the delay circuit comprises a conductive wire or at least one inverter.

3. The level shifter according to claim 2, wherein the delay circuit comprises the at least one first inverter and odd number of second inverters, wherein the at least one first inverter is connected with the odd number of second inverters into an inverter chain, or the delay circuit comprises the at least one third inverter and electronic elements.

4. The level shifter according to claim 1, wherein the comparison circuit comprises a current mirror circuit and a current comparison circuit.

5. The level shifter according to claim 4, wherein
the current mirror circuit comprises a first transistor, a second transistor, a third transistor and a fourth transistor, wherein the first transistor is electrically connected to the third transistor, and the second transistor is electrically connected to the fourth transistor, the gate of the first transistor is electrically connected to the gate of the second transistor, and the gate of the third transistor is electrically connected to the gate of the fourth transistor, and
the comparison circuit comprises a fifth transistor and a sixth transistor, wherein the fifth transistor is electrically connected to the first transistor, the sixth transistor is electrically connected to the second transistor, wherein the first transistor, the second transistor, the third transistor and the fourth transistor are P-type metal-oxide-semiconductor field-effect transistors (MOSFETs); the fifth transistor and the sixth transistor are N-type MOSFETs.

6. The level shifter according to claim 5, wherein
the gate of the first transistor and the gate of the second transistor are electrically connected to the drain of the first transistor;
the gate of the third transistor and the gate of the fourth transistor are electrically connected to the drain of the fourth transistor;
the source of the first transistor and the source of the second transistor are respectively connected to the drain of the third transistor and the drain of the fourth transistor, the source of the third transistor and the source of the fourth transistor are connected to a second high voltage signal, the drain of the second transistor outputs a first signal to the selection circuit;
the gate and the source of the fifth transistor are respectively connected to the first voltage signal and the ground;
the drain of the fifth transistor is connected to the drain of the first transistor;
the gate of the sixth transistor is electrically connected to the reverse-phase signal of the first voltage signal while the source of the sixth transistor is electrically connected to the ground; and
the drain of the sixth transistor is electrically connected to the drain of the second transistor.

7. The level shifter according to claim 1, wherein the selection circuit comprises an NOR logic circuit.

8. The level shifter according to claim 7, wherein the selection circuit further comprises:
an inverter for receiving the output signal of the NOR logic circuit and outputs the second voltage signal.

9. The level shifter according to claim 7, wherein the selection circuit comprises a seventh transistor, an eighth transistor, a ninth transistor, and a tenth transistor, wherein the first signal is connected to the gate of the seventh transistor and the gate of the tenth transistor; the second signal is connected to the gate of the eighth transistor and the gate of the ninth transistor.

10. The level shifter according to claim 1, wherein the comparison circuit comprises a eleventh transistor, a twelfth transistor, a thirteenth transistor, a fourteenth transistor, a fifteenth transistor and a sixteenth transistor, wherein the eleventh transistor, the twelfth transistor, the thirteenth transistor and the fourteenth transistor are N-type MOSFETs; the fifteenth transistor and the sixteenth transistor are P-type MOSFETs, wherein the eleventh transistor is connected to the thirteenth transistor while the twelfth transistor is connected to the fourteenth transistor, wherein the gate of the eleventh transistor is connected to the gate of the twelfth transistor; the gate of the thirteenth transistor is connected to the gate of the fourteenth transistor.

11. The level shifter according to claim 10, wherein
the gate of the eleventh transistor and the gate of the twelfth transistor are connected to the drain of the eleventh transistor;
the gate of the thirteenth transistor, the gate of the fourteenth transistor, the drain of the fourteenth transistor and the source of the twelfth transistor are electrically connected, the source of the thirteenth transistor and the source of the fourteenth transistor are electrically connected to a second low voltage signal;
the drain of the twelfth transistor is connected to the drain of the sixteenth transistor and outputs the first signal to the selection circuit;
the gate of the fifteenth transistor is connected to the first voltage signal while the drain of the fifteenth transistor is connected to the drain of the eleventh transistor; and
the gate of the sixteenth transistor is connected to the reverse-phase signal of the first voltage signal while the drain of the sixteenth is connected to the drain of the twelfth transistor.

12. The level shifter according to claim 1, wherein the selection circuit comprises an NAND logic circuit.

13. The level shifter according to claim 12, wherein the selection circuit further comprises:
an inverter that receives the output of the NAND logic circuit and outputs the second voltage signal.

14. The level shifter according to claim 12, wherein the selection circuit comprises a seventeenth transistor, an eighteenth transistor, a nineteenth transistor, and a twentieth transistor, wherein the first signal is connected to the gate of the seventeenth transistor, and the gate of nineteenth transistor, the second signal is connected to the gate of the eighteenth transistor and the gate of the twentieth transistor.

15. The level shifter according to claim 1, wherein the voltage of the first voltage signal is larger than a first sub-threshold voltage, the voltage of the second voltage signal is larger than a second sub-threshold voltage.

16. The level shifter according to claim 15, wherein the first sub-threshold voltage is no less than 0.1V, the second sub-threshold voltage is no less than 0.1V.

17. The level shifter according to claim 5, wherein the level shifter converts voltage 0.1V to 1.2V, when the standard supply voltage of the transistor is 1.2V.

18. The level shifter according to claim 5, wherein the level shifter converts voltage 0.1V to 2.5V, when the standard supply voltage of the transistor is 2.5V.

19. The level shifter according to claim 5, wherein the level shifter converts voltage 0.1V to 3.3V, when the standard supply voltage of the transistor is 3.3V.

20. An operation method for a level shifter, comprising:
receiving a first voltage signal;
comparing the first voltage signal with the reverse-phase signal of the first voltage to generate a first signal;
generating a second signal by delaying the first voltage signal, and
generating a second voltage signal by selecting the higher voltage signal from the first signal and the second signal.

21. The operation method for a level shifter according to claim 20, wherein the first signal is generated by a comparison circuit, and the comparison circuit comprises a Wilson current mirror.

22. The operation method for a level shifter according to claim 20, wherein the second signal is generated by a delay circuit.

* * * * *